United States Patent [19]

Sato

[11] Patent Number: 4,868,902
[45] Date of Patent: Sep. 19, 1989

[54] GAAS CAPACITIVE FEEDBACK TRANSIMPEDANCE AMPLIFIER

[75] Inventor: Robert N. Sato, Palos Verdes, Calif.

[73] Assignee: Hughes Aircraft Company, Los Angeles, Calif.

[21] Appl. No.: 151,845

[22] Filed: Feb. 3, 1988

[51] Int. Cl.$^4$ ............................................. G01J 5/04
[52] U.S. Cl. ................................. 250/332; 250/338.4; 330/9; 330/51; 330/253
[58] Field of Search ................. 250/332, 338.4, 338.1; 330/9, 51, 253, 109

[56] References Cited

U.S. PATENT DOCUMENTS

| | | | |
|---|---|---|---|
| 3,808,435 | 4/1974 | Bate et al. | 250/332 |
| 4,004,148 | 1/1977 | Howard et al. | 250/338.4 |
| 4,335,307 | 6/1982 | DeVries et al. | 378/97 |
| 4,594,562 | 6/1986 | Gurke et al. | 330/293 X |
| 4,616,189 | 10/1986 | Pengue, Jr. | 330/253 |
| 4,652,766 | 3/1987 | Wang et al. | 250/332 X |
| 4,659,928 | 4/1987 | Tew | 250/332 |
| 4,684,800 | 8/1987 | Morse et al. | 250/211 J |
| 4,709,141 | 11/1987 | Olsen | 250/332 X |
| 4,718,119 | 1/1988 | Salzer et al. | 330/278 X |
| 4,743,762 | 5/1988 | Gaalema et al. | 250/336.1 |

Primary Examiner—Eugene R. LaRoche
Assistant Examiner—Seung Ham
Attorney, Agent, or Firm—W. J. Streeter; A. W. Karambelas

[57] ABSTRACT

An integrating transimpedance amplifier 10 comprises a differential amplifier constructed of GaAs, MESFET, HEMT, SDHT or MODFET transistors has an input coupled to the output of a radiation detector 12 and an output expressive of the detector signal integrated over a predetermined interval of time. The amplifier has a transistor Q0 coupled to the input for coupling the input periodically to a predetermined voltage potential and a transistor Q9 coupled to the output of the amplifier for simultaneously periodically coupling the output to a predetermined voltage reference, thereby initializing the amplifier at the beginning of an integration period. A buffer transistor Q4 couples the output of the amplifier to a GaAs MISFET switch Q8 which is periodically activated to couple the buffered amplifier output to a storage capacitor Csmp. The buffer transistor also couples the output of the amplifier to a feedback capacitor Cf which is connected between the output of the buffer amplifier and the input of the amplifier for minimizing an effect associated with the radiation detector parasitic capacitance. The magnitude of the buffered amplifier output is stored on the capacitor at the beginning and end of the integration period. The sample signal is read out by a multiplexer twice during the integration period, the difference between the initial and final value of the buffer amplifier output being indicative of the radiation impinging on the detector minus one or more noise components.

16 Claims, 3 Drawing Sheets

GAAS CAPACITIVE FEEDBACK TRANSIMPEDANCE AMPLIFIER

FIELD OF THE INVENTION

The present invention relates to Gallium Arsenide (GaAs) analog and digital signal processors for an infrared (IR) sensor detector focal plane array (FPA), comprised of GaAs capacitive feedback transimpedance amplifiers (CTIA) operated at cryogenic temperatures.

BACKGROUND OF THE INVENTION

FPAs are typically comprised of a two-dimensional array of monolithic IR detectors. The individual detectors may be organized in a regular row and column, mosaic-type fashion. Such an array of detectors may be comprised of HgCdTe, InSb, GaAs:Mn or doped silicon semiconductor material. The IR detector induced signal from each of the IR detectors is typically coupled to FPA readouts, such as CTIA, source follower direct readout or charge coupled devices, where each of the signals are integrated over an interval of time and subsequently read out by a suitable multiplexing means. Research and development efforts on HgCdTe IR detectors have achieved many technical breakthroughs in long wavelength response with minimal cooling loads for long-duration system applications. It has been found that cryogenic temperature electronics with HgCdTe detector arrays for processing IR induced signals require a significant degree of material compatibility to achieve a long lifetime and reliable operation.

Also, FPA readouts require low device and circuit noise characteristics for obtaining a satisfactory signal-to-noise ratio. The readouts must also tolerate nuclear radiation in high nuclear environments, and also consume low power to achieve both weight and size reduction.

Typically, readouts chips are coupled to, or "bumped", with detector arrays at room temperature using indium bump technology. When the chips are cooled to a cryogenic operating temperature, stress can build up between the readout circuit and the detector array through the bumping if the coefficients of thermal expansion between the materials is sufficiently different and/or if the chips are large. Silicon, the conventional semiconductor material employed for readout circuits, has a poor thermal expansion match with the common detector materials such as HgCdTe and InSb. GaAs, on the other hand, offers a very close thermal match with these detector materials. Thus, the reliability problem related to bond pad stress can be eliminated by, in accordance with the invention, using GaAs as the semiconductor material for the readout circuit.

For an indium bump hybridized GaAs FPA readout array, GaAs material matches the temperature expansion coefficient of the HgCdTe IR detector array almost exactly within typical cryogenic temperature ranges. GaAs transistors are extremely tolerant of total dose radiation. The total dose radiation of biased GaAs enhancement mode (E−) and depletion mode (D−) field effect transistors (FETs) has been reported to be in excess of 1.0E8 Rads(Si). The observed shifts in threshold voltage of GaAs FETs due to the radiation are most probably related to increases in surface states between the metal and the semiconductor. This effect is analogous that observed in silicon FETs where increases in surface state density cause trapped charge to increase threshold voltage according to the thickness of the oxide. Unlike a silicon MOSFET, however, there is no accumulation of trapped charges in the oxide of a GaAs transistor because there is no oxide in the gate region. Thus, a silicon FET is much less tolerable to radiation than a GaAs transistor.

It is therefore one object of the present invention to provide a GaAs FPA signal processor which exhibits a low power consumption and an improved immunity to nuclear radiation (radiation hardness).

It is a further object of the present invention to provide a GaAs FPA signal processor which processes data at a high data gate and which permits a high circuit density.

It is a further object of the present invention to provide a GaAs FPA signal processor which exhibits low noise when employed in a FPA signal processor.

It is still one further object of the present invention to provide a GaAs FPA signal processor array which has a coefficient of thermal expansion which is similar to that of the material of many IR detecting arrays.

One still further object of the present invention is to provide a GaAs FPA signal processor array which readily compensates for process variations for providing uniform operation of signal processing circuitry across the array.

SUMMARY OF THE INVENTION

The foregoing problems are overcome and the objects of the invention are realized by a periodically charge integrating transimpedance amplifier which comprises a differential amplifier constructed of GaAs transistors having an input coupled to an I/R detector. A readout amplifier CTIA establishes an initial operating condition by accepting a command control signal periodically, including means coupled to the output of the readout for simultaneously controlling the readout output voltage to a predetermined voltage reference, thereby initializing the amplifier operating point at the beginning of an integration period. A buffer transistor couples the output of the readout to a sample and hold (S/H) circuit through a GaAs metal insulated FET (MISFET) switch which is periodically activated to transfer the buffered amplifier output voltage to the sample and hold circuit. The output of the buffer amplifier is coupled to a feedback capacitor which is connected between the output of the buffer amplifier and the input of the CTIA. The magnitude of the buffered amplifier output is stored in the S/H circuit at the beginning and end of the integration period. These stored signals are read out by a multiplexer (MUX) during the integration period. The MUX output provides both initial and final values of the sampled analog signal from the readout, the difference between the initial and final values being indicative of the radiation impinging on the detector.

In accordance with the invention, the GaAs CTIA has a number of desirable features unobtainable in circuitry constructed of silicon. For example, the coefficient of thermal expansion of the GaAs circuitry is similar to that of IR detecting arrays comprised of HgCdTe, InSb, GaAs:Mn or superlattice GaAs. GaAs FETs also are more radiation resistant and have a lower operating power consumption than silicon based FETs.

The invention further provides for a CTIA having a novel circuit configuration which interfaces to an IR detector to amplify the IR induced signal, a sample and hold (S/H) circuit having a GaAs MISFET as a signal path switch and a high-speed, low-power MUX circuit to deliver signals from each IR detector pixel to a chip driver. As opposed to photoconductive IR detectors photovoltaic HgCdTe or InSb IR detectors require a small band and stable detector bias voltage. The conventional and widely used source follower direct (SFD) readout implementation with such HgCdTe or InSb IR detectors will not satisfy these stringent operating requirements. A GaAs capacitive coupled transimpedance amplifier (CTIA), in accordance with the invention, meets these requirements because GaAs provides, relative to silicon, excellent material physical properties.

Good GaAs device 1/f noise characteristics, operating at extremely low power at cryogenic temperatures, are utilized by the invention. This low noise performance is believed to be due in part to a processing technique of implanting a beryllium p-type barrier layer between the transistor gate region and the semi-insulating GaAs substrate.

Transistor transconductance relates to the gain-bandwidth product and the amplification (gain) of a circuit. Electron mobility determines the transistor transconductance for given operating currents for a transistor operating beyond the subthreshold region. The larger the electron mobility, the lower the bias current needed to achieve the same gain. Hence, less operating power is required to achieve a given transconductance for a transistor of a given geometry. GaAs electron mobility is at least five times larger than silicon, the mobility becoming larger as the operating temperature is lowered. Thus, the readout circuit of the invention which is comprised of GaAs transistors exhibits superior transconductance and operating power characteristics relative to a readout circuit comprised of conventional silicon transistors.

BRIEF DESCRIPTION OF THE DRAWINGS

These and other aspects of the invention will become more apparent herein in the detailed description of the invention taken in conjunction with the accompanying drawings wherein.

DETAILED DESCRIPTION OF THE INVENTION

Figure 1:
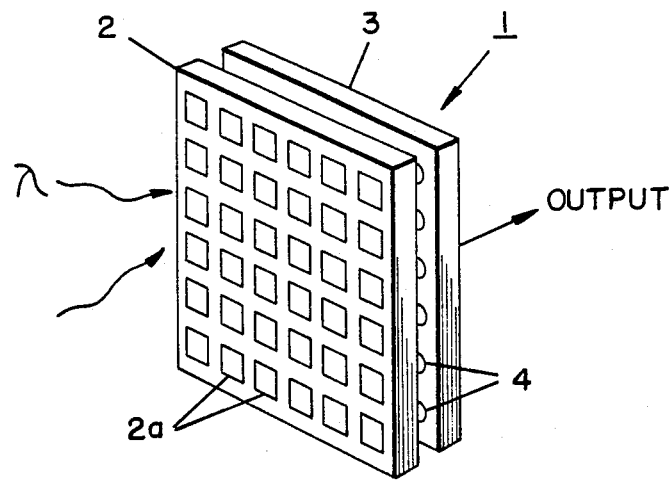
FIG. 1 is an illustrative view of a FPA of IR detectors coupled to an array of FPA readout devices.

Referring now to FIG. 1 it can be seen that a FPA 1 comprises a N(column) by M(row) mosaic array 2 of radiation detectors, such as IR detectors 2a. IR induced signals from each detector 2a of the array 2 are amplified, integrated, sampled and held by a sampling capacitor and multiplexed by a readout array 3.

In general, the readout multiplexing of the invention may be practiced by at least two techniques. One technique involves multiplexing each unit cell of the Mth column and subsequently multiplexing all N channels to provide a signal output from the array 3. A second technique involves multiplexing the Mth column, as above, then outputting each channel independently. This reduces multiplexing complexity but increases the number of outputs from array 3.

Typically, the arrays 2 and 3 are hybridized by a plurality of indium "bumps" 4. Of course, the drawing of FIG. 1 is illustrative only, it being realized that the number of IR detectors is variable over a wide range depending upon the required resolution and other factors for a given application.

Figure 2:
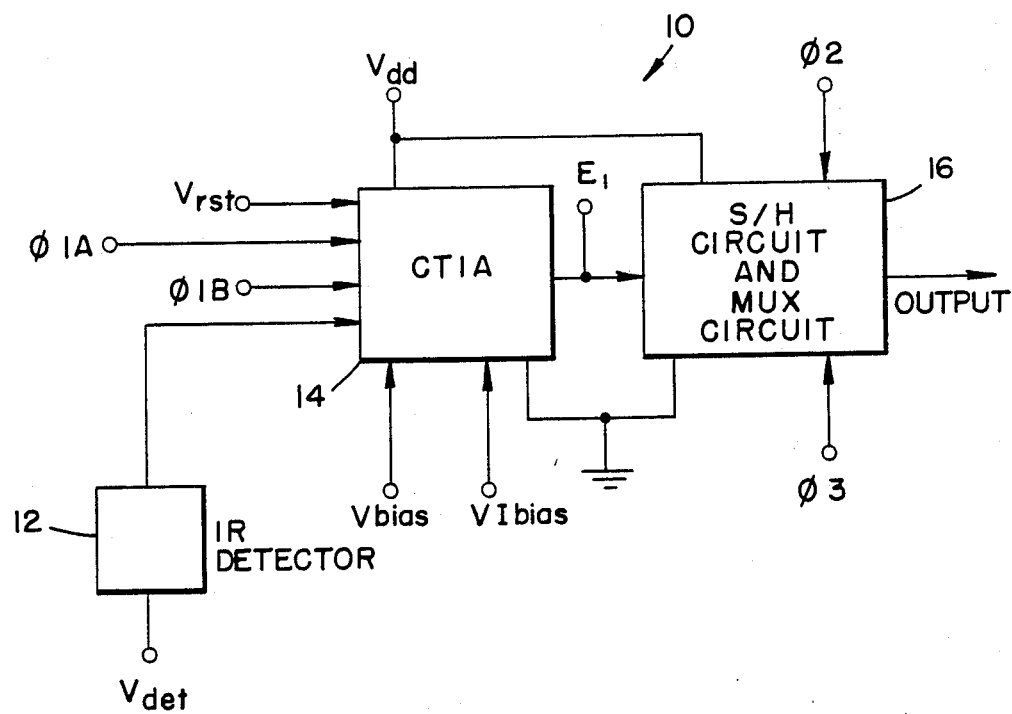
FIG. 2 is a block diagram showing the GaAs readout of the present invention.

Referring now to FIG. 2 there is illustrated in block diagram form a readout unit cell 10 of the array 3, the array 3 being comprised of a plurality of such readout unit cells, individual ones of which are coupled to a corresponding detector of the array 2. As can be seen, the readout unit cell 10 is comprised of a CTIA 14 which is one feature of the invention. CTIA 14 may be utilized with either a photovoltaic p-n or n-p or a photoconductive radiation detector 12. IR Detector 12 is generally biased to a desired operating point and is coupled to an input of the CTIA 14. The CTIA 14 is controlled by a plurality of clocks, such as the integration command clocks Phi 1A and Phi 1B. CTIA 14 is also biased by voltages Vbias, VIbias and Vrst. The CTIA 14 may be powered by a single power supply voltage (Vdd). The IR induced signal which is integrated by CTIA 14 is provided to a S/H and MUX circuit 16. S/H 16 is controlled by clock (Phi 2). The multiplexed output of the S/H 16 is a unit cell sampled analog signal (OUTPUT).

Figure 3:
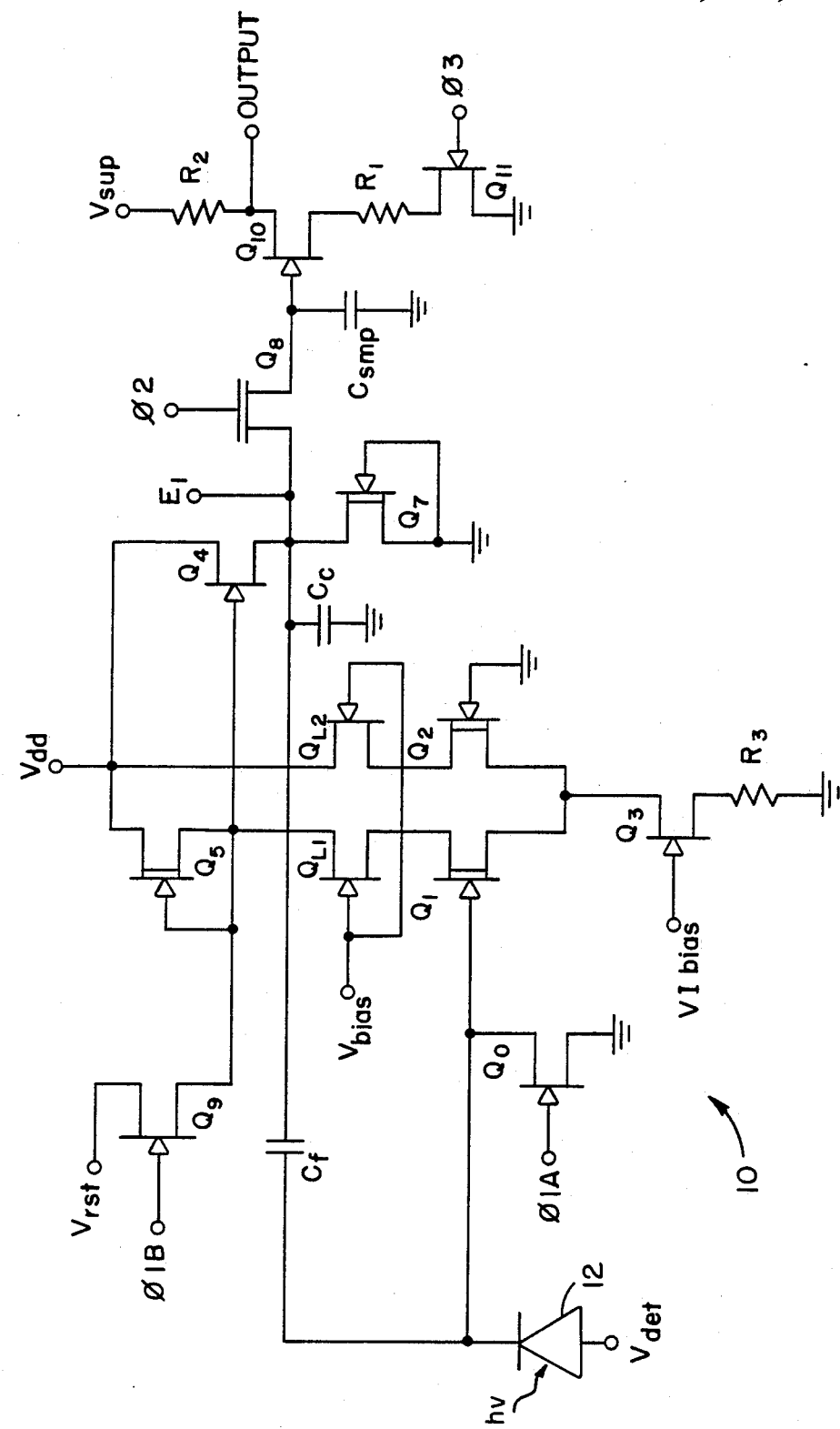
FIG. 3 is a schematic diagram which shows in detail the circuitry of the block diagram of FIG. 2.

Referring now to FIG. 3 a schematic diagram of a FPA signal processor unit cell 10 is shown. A photovoltaic or photoconductive semiconductor radiation detector, which may be an IR detector 12, senses the variation in photon flux within a specified spectral wavelength range and generates an input signal voltage to the CTIA circuit. The GaAs CTIA circuit beneficially provides a constant voltage across the IR detector by means of a feedback capacitance $C_f$, the feedback signal having a magnitude linearly related to the magnitude of a CTIA output signal.

CTIA 14 comprises a plurality of GaAs FETs. In particular, CTIA 14 comprises a differential amplifier pair $Q_1$ and $Q_2$, each having a load represented by transistors $Q_{L1}$ and $Q_{L2}$, respectively, coupled to a drain thereof. $Q_1$ has an additional load in the form of transistor $Q_5$. A source terminal of each of the differential amplifier pair $Q_1$ and $Q_2$ is coupled to the drain of a transistor $Q_3$ which functions as a current source. A bias voltage VIbias has a voltage magnitude the value of which is selected to provide a desired current through $Q_3$, which in turn provides current to both $Q_1$ and $Q_2$. Another source of bias voltage is provided to the gates of load transistors $Q_{L1}$ and $Q_{L2}$, namely Vbias. The voltage magnitude of Vbias establishes the drain voltages of both $Q_1$ and $Q_2$ at a desired level, thereby preventing drain-source saturation of $Q_1$ and $Q_2$. Transistor $Q_{L1}$ is used in common gate configuration to amplify the signal current from transistor $Q_1$. The voltage level of adjustable voltage references VIbias and Vbias are selected, in accordance with one aspect of the invention, for compensating for process and manufacturing induced variations in the operating characteristics of the unit cells within the array 2. An enhancement mode transistor, $Q_9$, forces the CTIA output circuit operating voltage to a desired initial condition irregardless of the value of $Q_1$, $Q_2$, $Q_{L1}$, $Q_{L2}$ and/or $Q_5$ transconductance, channel conductance and/or threshold voltage variations. The switching of $Q_9$ is controlled by command clock Phi IB coupled to the gate thereof, the source of $Q_9$ being biased by Vrst. The voltage level of Vrst may be determined by the polarity of the associated IR detector 12. Transistor $Q_0$ acts as a switch, similar to $Q_9$, and is turned on periodically by clock Phi 1A according to the required integration period. When both $Q_9$ and $Q_0$ are turned on, the feedback capacitance $C_f$ is discharged to an initial condition. Simultaneous with the discharging of $C_f$, $Q_0$ forces the CTIA input to a desired voltage potential, such as ground, to maintain a desired bias voltage across the IR detector 12.

The IR detector induced signal is amplified by differential pair $Q_1$ and $Q_2$ in conjunction with $Q_{L1}$ and $Q_{L2}$ after which the amplified signal is provided to the gate of buffer transistor $Q_4$, which is operated in a source follower configuration. Buffer transistor $Q_4$ has coupled to the source terminal thereof the aforementioned feedback capacitor $C_f$. In general, buffer transistor $Q_4$ provides a low-impedance source to the feedback path and also to the S/H circuit, $Q_4$ thereby functioning as an isolating element between the CTIA output and the S/H circuit. Transistor $Q_7$ functions as a load for the transistor $Q_4$.

The aforementioned S/H circuit is comprised of a GaAs MISFET switching transistor $Q_8$ and a charge storage capacitor $C_{smp}$. In accordance with the invention, the GaAs MISFET transistor $Q_8$ is constructed as a modified GaAs transistor similar to a silicon metal oxide field effect transistor (MOSFET).

MISFET $Q_8$ functions as a substantially ideal switch in the signal path, having a low on-resistance and a very high-off resistance. A MISFET structure fabricated in GaAs, much like a silicon MOS device, is not subject to being forward biased by the applied gate voltage. Hence, the clock pulse Phi 2 can be applied to the gate of MISFET $Q_8$ without danger of forward biasing the gate-to-source. The signal from the CTIA buffer is sampled and stored across the sampling capacitor $C_{smp}$.

Enhancement-mode FET $Q_{10}$ functions as an amplifier, delivering a sampled analog signal to a chip driver. $Q_{10}$ forms part of the multiplexer circuit which includes a source resistor R1 and a load resistor R2. R1 and R2 may have the same resistance value in order to achieve a unity gain feedback amplifier at the multiplexed output. $Q_{10}$ senses the stored charge across the sampling capacitor $C_{smp}$. $Q_{10}$ is activated by the Phi 3 clock which is applied to the gate of $Q_{11}$. When Phi 3 is applied, $Q_{11}$ is turned on thereby providing current through R1 to the unity gain wideband amplifier $Q_{10}$. The signal OUTPUT has a voltage magnitude substantially equal to the voltage across $C_{smp}$, or the sampled analog signal.

Figure 4:
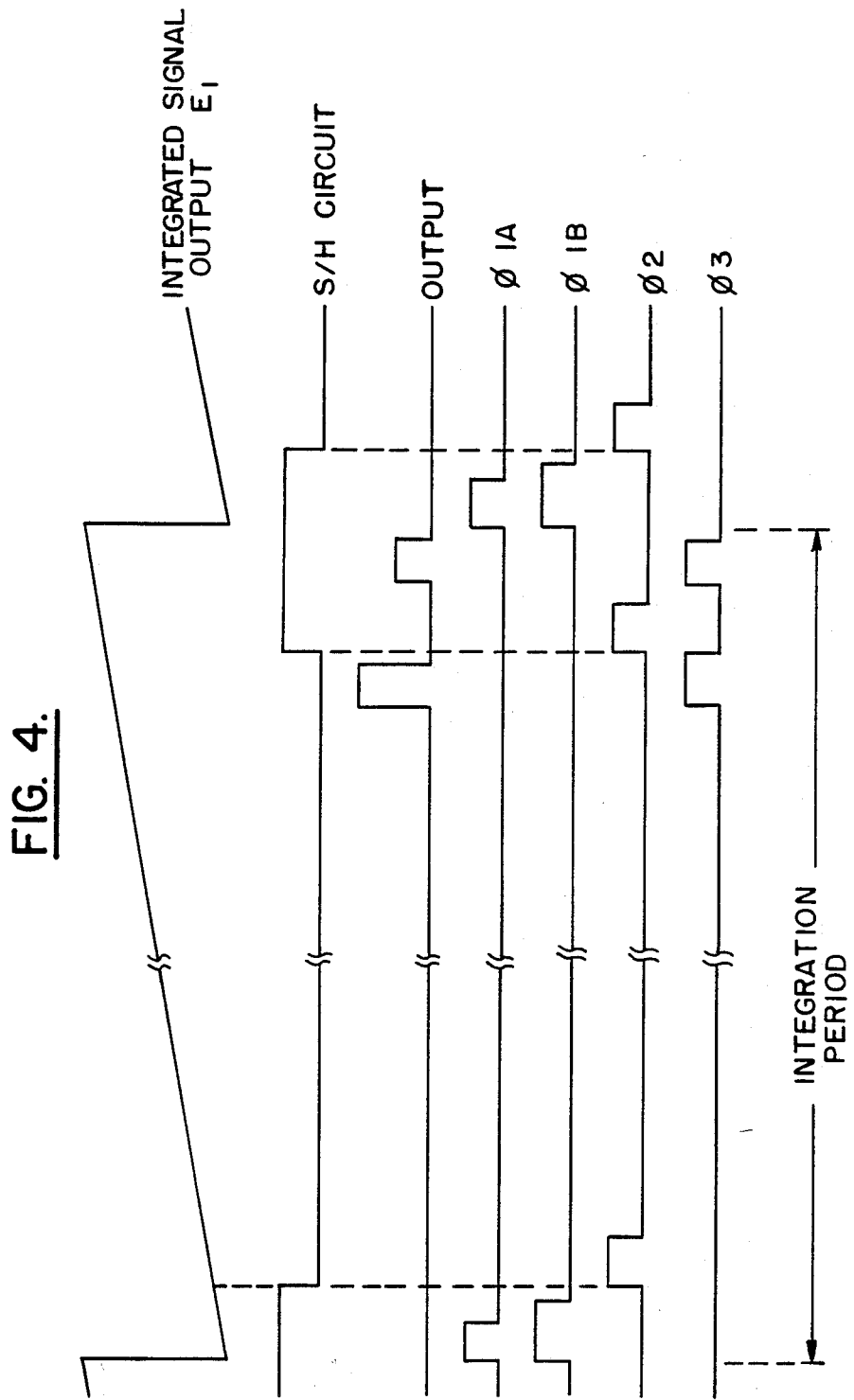
FIG. 4 is a timing diagram which illustrates the operation of the circuitry of FIG. 3.

Referring now to FIG. 4 a timing diagram of a single integration period illustrates, in accordance with a method of the invention, the operation of the circuitry shown in FIG. 3. The signal appearing at the CTIA output, designated $E_1$ in FIG. 3, is the integrated IR induced signal. The signal is integrated over an integration period and has an integration slope which is determined by a combination of the detected IR photons, the detector characteristics and the value of feedback capacitor, $C_f$. The clocks Phi 1A and Phi 1B occur at substantially the same time during the integration period, the Phi 1B signal however, having a slightly longer pulse duration. A positive going pulse, Phi 1A, turns on transistor $Q_0$ thereby effectively shorting the input of CTIA 14 to circuit ground. This has the effect of discharging the feedback capacitor $C_f$, thereby resetting the feedback capacitor. Phi 1B turns on transistor $Q_9$, thereby establishing the desired potential, Vrst, at the circuit node which comprises the drain of $Q_{L1}$, the gate and source of load transistor $Q_5$ and the gate of buffer transistor $Q_4$. The output of the CTIA is thereby reset to a desired operating voltage potential at the beginning of each integration period by selecting the Vrst voltage level.

The clock Phi 1B has a slightly longer duration such that the operating point for the CTIA 14 may be established subsequent to the resetting of capacitor $C_f$. Shortly after the clock signal Phi 1B is turned off, thereby cutting off transistor $Q_9$ conduction, the Phi 2 clock is turned on which causes electrical coupling of the CTIA buffer output to $C_{smp}$. The Phi 2 clock is applied at the beginning of the integration period. The clock Phi 3 is applied before resampling the CTIA output thereby reading out the initial value of the CTIA output signal which is stored by the S/H circuit. The Phi 2 clock is again applied to the gate of $Q_8$ to sample the final value of the CTIA output before the end of the integration period. Clock Phi 3 is once more applied to sense the voltage across $C_{smp}$.

Thus, the MUX circuit output provides two sampled analog pulses per integration period, the magnitude of the pulses corresponding to the beginning and end values of the CTIA output. These two pulses are later processed, such as by subtracting them, to reduce buffer 1/f and KTC noise. During the integration period $C_f$ feeds back to the input of CTIA 14 a voltage signal linearly related to the output of signal CTIA 14, the capacitive feedback minimizing any intrinsic capacitance associated with the IR detector 12 and any parasitic capacitance associated with the coupling between the detector array and the readout array.

It should be realized that the FPA signal processor of the invention, that is an FPA signal processor using GaAs semiconductor material, has a number of advantages over a FPA signal processor comprised of Si. As has been stated, the FPA signal processor of the invention has a similar thermal expansion coefficient as that of an associated HgCdTe, InSb, GaAs:Mn or superlattice GaAs detector array. Thus, thermal cycling between room and cryogenic temperatures does not induce mechanical stresses. Furthermore, the higher electron mobility of GaAs results in transistors having a transconductance value equivalent to that of silicon transistors but with a substantial reduction in operating power.

It should also be realized that the circuitry disclosed herein provides for advantageously setting the operating point of the CTIA amplifier to a desired condition at the beginning of each integration period while also providing for the biasing of an associated IR detector at an optimum operating point.

It should further be realized that the invention provides for the employment of GaAs Metal Semiconductor Field Effect Transistors (MESFETs), High Electron Mobility Transistors (HEMTs), Selectively Doped Heterostructure Transistors (SDHTs) or Modulation Doped Field Effect Transistors (MODFETs) for the readout circuit.

It can therefore be appreciated that an illustrative embodiment only of the invention has been disclosed herein and that modifications to the embodiment disclosed may occur to those having skill in this art. Thus, the invention is not to be considered as limited to the embodiment disclosed, the invention is instead meant to be limited only as defined by the appended claims.

What is claimed is:

1. A capacitive feedback transimpedance amplifier integrated circuit comprising:
   means, having an input terminal for coupling to an output signal of an IR detector, for amplifying said detector output signal to produce at an output terminal an amplifier output signal;
   means, coupled to said input terminal, for periodically coupling said input terminal to a first predetermined voltage potential;
   means, coupled to said output terminal, for periodically coupling said output terminal to a second predetermined voltage potential; and
   means, coupled between said output terminal and said input terminal, for feeding back to said input terminal a feedback signal having a magnitude linearly related to a magnitude of said amplifier output signal.

2. A capacitive feedback transimpedance amplifier as defined in claim 1 wherein said means for feeding back comprises:
   a buffer amplifier having a buffer amplifier input terminal coupled to said output terminal, said buffer amplifier further having a buffer amplifier output terminal; and
   a capacitor having a first terminal coupled to said buffer amplifier output terminal and a second terminal coupled to said amplifier input terminal for coupling said feedback signal from said buffer amplifier output terminal to said input terminal.

3. A capacitive feedback transimpedance amplifier as defined in claim 2 wherein said amplifying means comprises:
   a differential amplifier comprising a first and a second amplifier transistor connected in parallel one to another, each having a source terminal coupled to an output of a current source means, said first amplifier transistor having a gate terminal for coupling to said radiation detector output signal, said second amplifier transistor having a gate terminal coupled to a circuit ground, each of said first and second amplifier transistors first and a second load means, respectively.

4. A capacitive feedback transimpedance amplifier as defined in claim 3 wherein said first load means comprises two serially coupled load transistors disposed between said drain terminal of said first amplifier transistor and a voltage source, said first load transistor comprising:
   a source terminal coupled to said drain terminal of said first amplifier transistor,
   a drain terminal coupled to a source and a gate terminal of said second load transistor and also to said buffer amplifier input terminal, and
   a gate terminal coupled to said second load means and also to a first variable voltage potential having a predetermined magnitude for adjusting the current flow through said first and said second amplifier transistors to achieve a desired voltage potential at said drain of each of said amplifier transistors.

5. A capacitive feedback transimpedance amplifier as defined in claim 4 wherein said current source means comprises:
   a current sourcing transistor having a source terminal coupled to said circuit ground, a drain terminal coupled to said source terminals of said first and said second amplifier transistors, and a gate terminal coupled to a second variable voltage potential having a predetermined magnitude for adjusting the current flow through said first and second amplifier transistors.

6. A capacitive feedback transimpedance amplifier as defined in claim 2 and further comprising:
   means for storing a charge signal having a magnitude linearly related to a magnitude of said radiation detector output signal;
   means, coupled between said buffer amplifier output terminal and said storing means, for periodically impressing upon said storing means said charge signal; and
   means, coupled to said storing means, for periodically outputting a voltage signal having a magnitude linearly related to the magnitude of said radiation detector output signal.

7. A capacitive feedback transimpedance amplifier as defined in claim 6 wherein said transimpedance amplifier is comprised of GaAs and wherein said impressing means is a MISFET GaAs transistor having a drain and a source terminal coupled between said buffer amplifier output terminal and said storing means, said MISFET GaAs transistor further having a gate terminal coupled to a clock signal which periodically causes said MISFET GaAs transistor to conduct thereby impressing upon said storing means said buffer amplifier output signal.

8. A method of determining a magnitude of an output signal of an IR detector over a predetermined interval of time with a capacitive feedback transimpedance amplifier (CTIA) having an input coupled to the IR detector output signal, comprising the steps of:
   (a) resetting the CTIA to an initial operating condition by
   coupling the input of the transimpedance amplifier to a first predetermined voltage potential while coupling an output of the transimpedance amplifier to a second predetermined voltage potential;
   uncoupling the input of the transimpedance amplifier from the first predetermined voltage potential; and
   uncoupling the output of the transimpedance amplifier from the second predetermined voltage potential;
   (b) sampling an output signal of the CTIA to determine an initial magnitude of the transimpedance amplifier output signal;
   (c) storing the initial magnitude;
   (d) reading out the initial magnitude;
   (e) sampling the output signal of the CTIA amplifier to determine a final magnitude of the output signal at substantially the end of the predetermined interval of time;
   (f) storing the final magnitude; and
   (g) reading out the final magnitude.

9. A method as defined in claim 8 wherein while the steps (a)–(g) are accomplished further includes a step of feeding back the output signal of the transimpedance amplifier to the input of the transimpedance amplifier through a feedback capacitor.

10. A method as defined in claim 9 wherein the step of reading out the initial magnitude is accomplished substantially immediately before the step of sampling the final magnitude.

11. A method as defined in claim 10 wherein the CTIA is comprised of GaAs transistors and wherein the steps of sampling are accomplished by energizing a MISFET GaAs transistor to couple the amplifier output signal to a sample and hold storage capacitor.

12. A method as defined in claim 10 and further comprising a step of subtracting the initial magnitude of the output signal from the final magnitude of the output signal whereby at least a 1/f noise component of the output signal is substantially cancelled.

13. A method as defined in claim 10 wherein the CTIA is comprised of MESFET, HEMT, SDHT or MODFET transistors and wherein the steps of sampling are accomplished by energizing a MISFET GaAs transistor to couple the amplifier output signal to a sample and hold storage capacitor.

14. A radiation detector readout integrated circuit for use at cryogenic temperatures having a plurality of transistor devices comprised of GaAs, said circuit comprising:

an input stage, said input stage comprising
a differential amplifier including a first and a second amplifier transistor connected in parallel one to another, each having a source terminal coupled to an output of a current source transistor, said first amplifier transistor having a gate terminal for coupling to a radiation detector output signal, said second amplifier transistor having a gate terminal coupled to a circuit ground, each of said first and second amplifier transistors further having a drain terminal coupled to a first and a second load means, respectively;
a first switching transistor coupled between said gate terminal of said first amplifier transistor and a first voltage potential, said first switching transistor further having a gate terminal coupled to a first clock signal for periodically coupling said first amplifier transistor gate terminal to the first voltage potential;
a second switching transistor coupled between an output of said input stage and a second voltage potential, said second switching transistor further having a gate terminal coupled to a second clock signal for periodically coupling said output of said input stage to the second voltage potential; and an output stage comprising
a buffer amplifier having a buffer amplifier input terminal coupled to said output of said input stage, said buffer amplifier further having a buffer amplifier output terminal;
a first capacitor having a first terminal coupled to said buffer amplifier output terminal and a second terminal coupled to said gate terminal of said first amplifier transistor for feeding back a signal from said buffer amplifier output terminal to said gate terminal of said first amplifier transistor;
a MISFET transistor having a drain and a source terminal coupled between said buffer amplifier output terminal and a second capacitor, said MISFET transistor further having a gate terminal coupled to a third clock signal which periodically causes said MISFET transistor to conduct thereby impressing upon said second capacitor said buffer amplifier output signal; and
an output transistor having a gate terminal coupled to said second capacitor and a source terminal coupled to a fourth clock signal for periodically outputting a signal having a magnitude which is a function of a magnitude of the radiation detector output signal.

15. A circuit as set forth in claim 14 wherein said current source transistor has a source terminal coupled to circuit ground, a drain terminal coupled to said source terminals of said first and said second amplifier transistors, and a gate terminal coupled to a first source of bias voltage potential.

16. A circuit as set forth in claim 15 wherein said load means comprises a first load transistor coupled to the drain of said first amplifier transistor and a second load transistor coupled to the drain of said second amplifier transistor, each of said first and second load transistors having a gate terminal coupled to a second source of bias voltage potential.

* * * * *

UNITED STATES PATENT AND TRADEMARK OFFICE
CERTIFICATE OF CORRECTION

PATENT NO.  : 4,868,902

DATED       : September 19, 1989

INVENTOR(S) : ROBERT N. SATO

It is certified that error appears in the above-identified patent and that said Letters Patent is hereby corrected as shown below:

Column 7, Line 41, Claim 3, after "transistors", insert
--further having a drain terminal coupled to a--.

Signed and Sealed this

Third Day of September, 1991

Attest:

HARRY F. MANBECK, JR.

*Attesting Officer*    *Commissioner of Patents and Trademarks*